United States Patent
Hsieh et al.

(10) Patent No.: US 7,111,193 B1
(45) Date of Patent: Sep. 19, 2006

(54) SEMICONDUCTOR MEMORY HAVING RE-CONFIGURABLE FUSE SET FOR REDUNDANCY REPAIR

(75) Inventors: Chen Hui Hsieh, Hsin-Chu (TW); I-Fay Wang, Hsin-Chu (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 461 days.

(21) Appl. No.: 10/209,148

(22) Filed: Jul. 30, 2002

(51) Int. Cl.
*G06F 11/00* (2006.01)

(52) U.S. Cl. .......................... 714/7; 714/710; 365/200

(58) Field of Classification Search .................. 714/42, 714/710, 711, 7; 365/200, 201
See application file for complete search history.

(56) References Cited

U.S. PATENT DOCUMENTS

| | | | | |
|---|---|---|---|---|
| 4,648,075 A * | 3/1987 | Segawa et al. | ............. | 365/200 |
| 4,751,656 A * | 6/1988 | Conti et al. | ..................... | 716/1 |
| 5,005,158 A * | 4/1991 | McClure et al. | ............ | 365/200 |
| 5,281,868 A * | 1/1994 | Morgan | ........................ | 326/10 |
| 5,359,560 A * | 10/1994 | Suh et al. | .................... | 365/200 |
| 5,430,679 A | 7/1995 | Hiltebeitel et al. | .......... | 365/200 |
| 5,646,896 A | 7/1997 | Pinkham | ...................... | 365/200 |
| 5,706,292 A * | 1/1998 | Merritt | ........................ | 714/710 |
| 5,732,029 A * | 3/1998 | Lee et al. | .................... | 365/200 |
| 5,801,986 A * | 9/1998 | Matsumoto et al. | .... | 365/185.09 |
| 5,835,425 A * | 11/1998 | Berger | ......................... | 365/200 |
| 5,835,431 A * | 11/1998 | Miner et al. | ................. | 365/201 |
| 6,018,811 A | 1/2000 | Merritt | ........................ | 714/711 |
| 6,073,258 A * | 6/2000 | Wheater | ...................... | 714/718 |
| 6,144,593 A * | 11/2000 | Cowles et al. | .............. | 365/200 |
| 6,188,617 B1 * | 2/2001 | Goebel | ........................ | 365/200 |
| 6,249,465 B1 * | 6/2001 | Weiss et al. | ................. | 365/200 |
| 6,388,925 B1 * | 5/2002 | Kim | .............................. | 365/200 |
| 6,434,064 B1 * | 8/2002 | Nagai | .......................... | 365/200 |
| 6,505,324 B1 * | 1/2003 | Cowan et al. | ................. | 716/4 |
| 6,789,238 B1 * | 9/2004 | Swanson et al. | ............... | 716/4 |

* cited by examiner

*Primary Examiner*—Robert Beausoliel
*Assistant Examiner*—Philip Guyton

(57) ABSTRACT

This invention provides a circuit and a method for re-configuring fuse sets for memory cell array redundancy repair. In addition this invention relates to the use of fuse sets and spare row and column lines in the memory array to repair memory cell defects. Each fuse set can be used for either a row or a column, as needed, during a repair of the memory array. This allows the fuse sets to be allocated freely according to the process defects distribution on the chip and wafer. This results in higher repair efficiency and increased wafer yield.

22 Claims, 7 Drawing Sheets

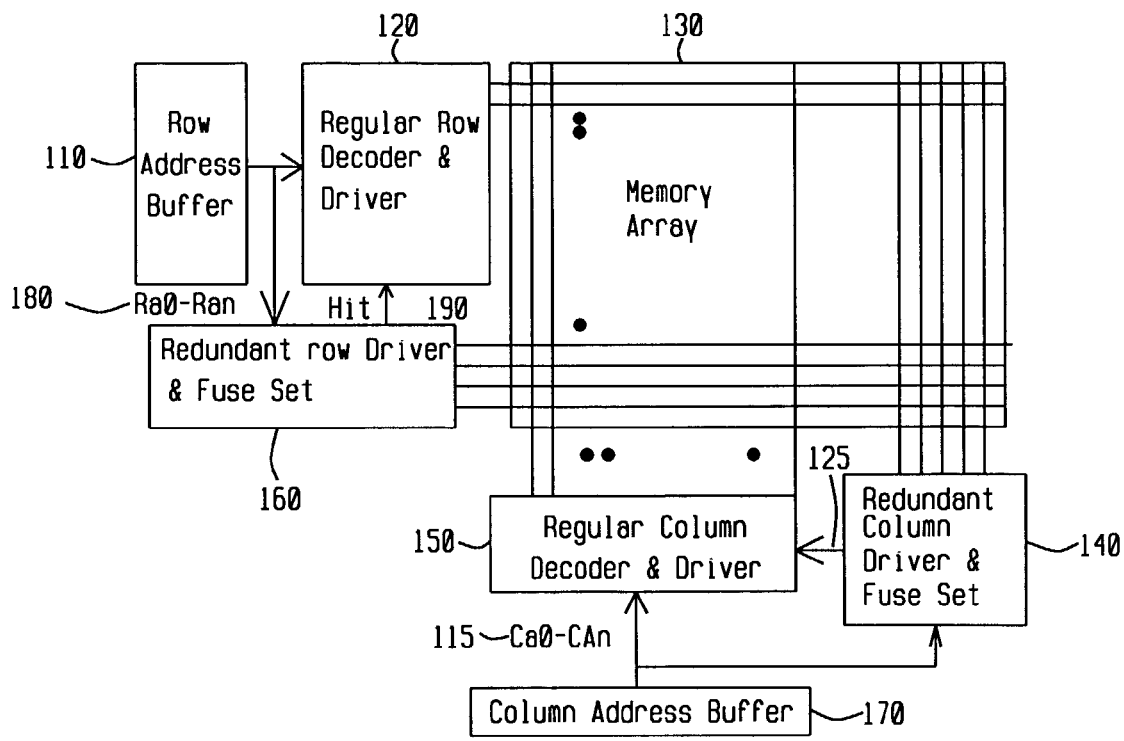
*FIG. 1 - Prior Art*
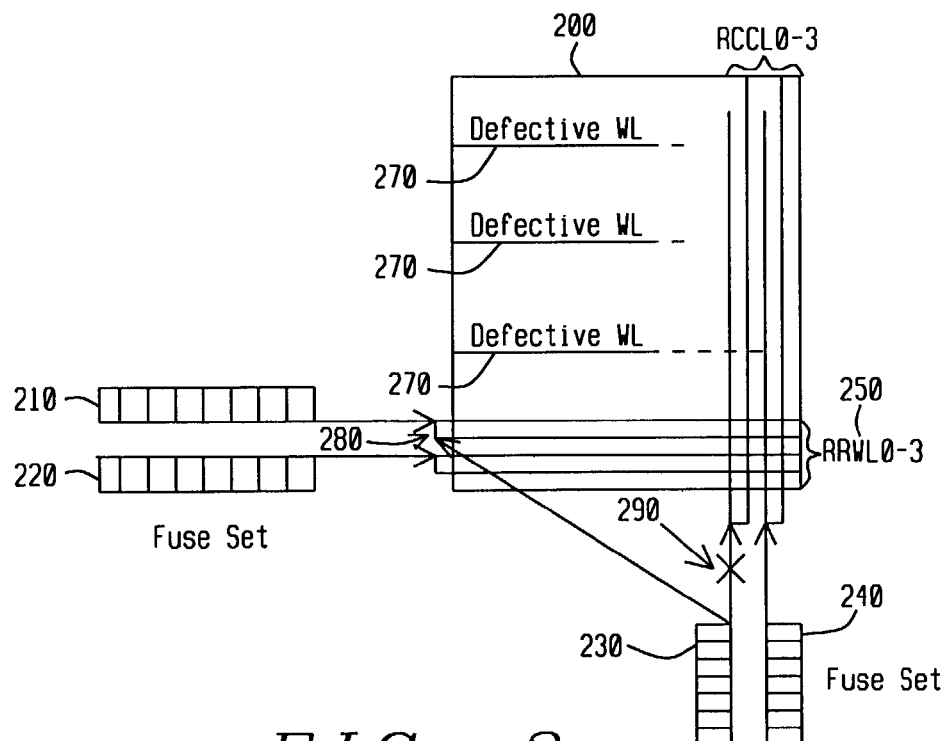
*FIG. 2*

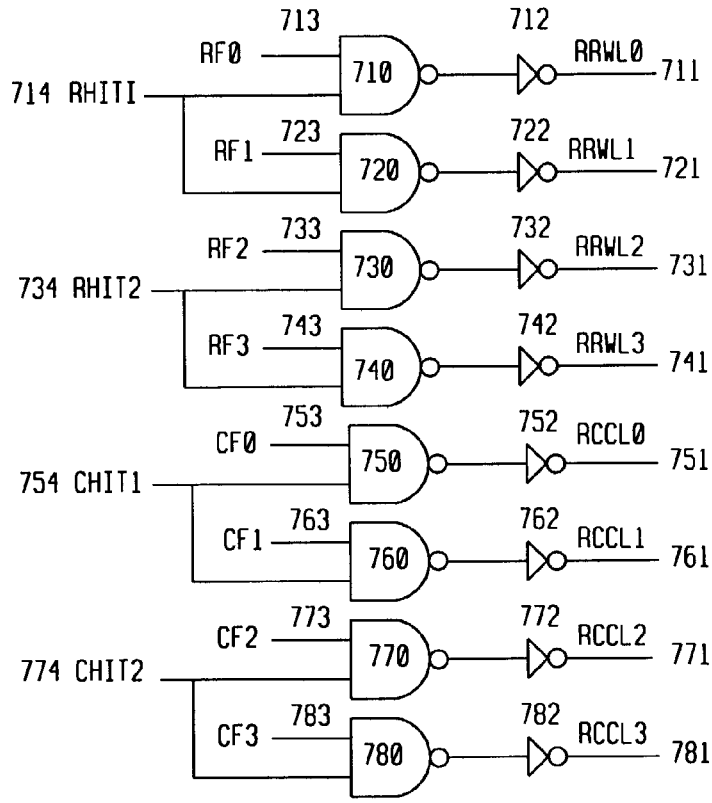
FIG. 7 - Prior Art
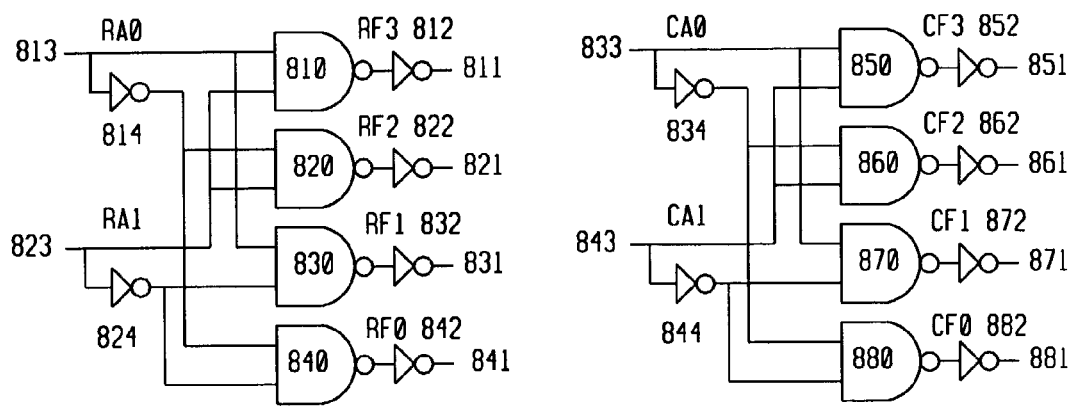
FIG. 8

US 7,111,193 B1

SEMICONDUCTOR MEMORY HAVING RE-CONFIGURABLE FUSE SET FOR REDUNDANCY REPAIR

BACKGROUND OF THE INVENTION

1. Field of the Invention

This invention relates to a circuit and a method for reconfiguring fuse sets for memory cell array redundancy repair.

More particularly this invention relates to the use of fuse sets and spare row and column lines in the memory array to repair memory cell defects.

2. Description of Related Art

FIG. 1 shows a prior art memory block diagram. The memory array 130 is accessed via the regular row decoder and driver block 120, and via the regular column decoder and driver block 150. The row address buffer 110 drives both the regular row decoder/driver 120 and the redundant row driver and fuse set 160. The output of the redundant row driver and fuse set 160 is a 'Hit' output signal 190. This 'Hit' 190 output indicates that the row address 180 equals any address in the redundant row driver and fuse set 160.

Similarly, the column address buffer 170 drives both the regular column decoder/driver 150 and the redundant column driver and fuse set 140. The output of the redundant column driver and fuse set 140 is a 'Hit' output signal 125. This 'Hit' 125 output indicates that the column address 115 equals any address in the redundant column driver and fuse set 140.

U.S. Pat. No. 5,430,679 (Hiltebeitel, et al.) "Flexible Redundancy Architecture and Fuse Download Scheme" describes a fuse download system for programming decoders for redundancy. The fuse sets can be dynamically assigned on an any-for-any basis.

U.S. Pat. No. 5,646,896 (Pinkham) "Memory Device with Reduced Number of Fuses" discloses a memory device with a reduced number of fuses. Fuse programming circuits are shared between memories.

U.S. Pat. No. 6,018,811 (Merritt) "Layout for Semiconductor Memory Device Wherein Intercoupling Lines are Shared by Two Sets of Fuse Banks and Two Sets of Redundant Elements Not Simultaneously Active" discloses a circuit where intercoupling lines are shared by two banks of fuses."

BRIEF SUMMARY OF THE INVENTION

It is the objective of this invention to provide a circuit and a method for re-configuring fuse sets for memory cell array redundancy repair.

It is further an object of this invention to use fuse sets and spare row and column lines in the memory array to repair memory cell defects.

It is further an object of this invention to allow each fuse set to be used for either a row or a column line as needed during a repair of the memory.

The objects of this invention are achieved by a circuit which re-configures the fuse sets in a semiconductor memory integrated circuit, which utilizes redundant memory rows and columns to repair defective cells within memory cell arrays to improve product yield. The circuit is made up of fuse sets which allow unused word lines of the memory cell array to be used to replace defective word lines. The circuit is also made up of fuse sets which allow unused column lines of the memory cell array to be used to replace defective column lines. In addition, the circuitry provides for the use of unused fuse sets of column lines to repair defective word lines and which allows the use of unused fuse sets of word lines to repair defective column lines.

BRIEF DESCRIPTION OF THE DRAWINGS

FIG. 1 shows a prior art block diagram of a memory array with redundant row and column drivers.

FIG. 2 gives a block diagram showing the memory array with a need to use a spare column fuse sets to repair a row defect.

FIG. 7 shows the redundancy word line and column line drivers.

FIG. 8 shows the row factors and column factors address decoders of this invention.

DETAILED DESCRIPTION OF THE INVENTION

Figure 3:
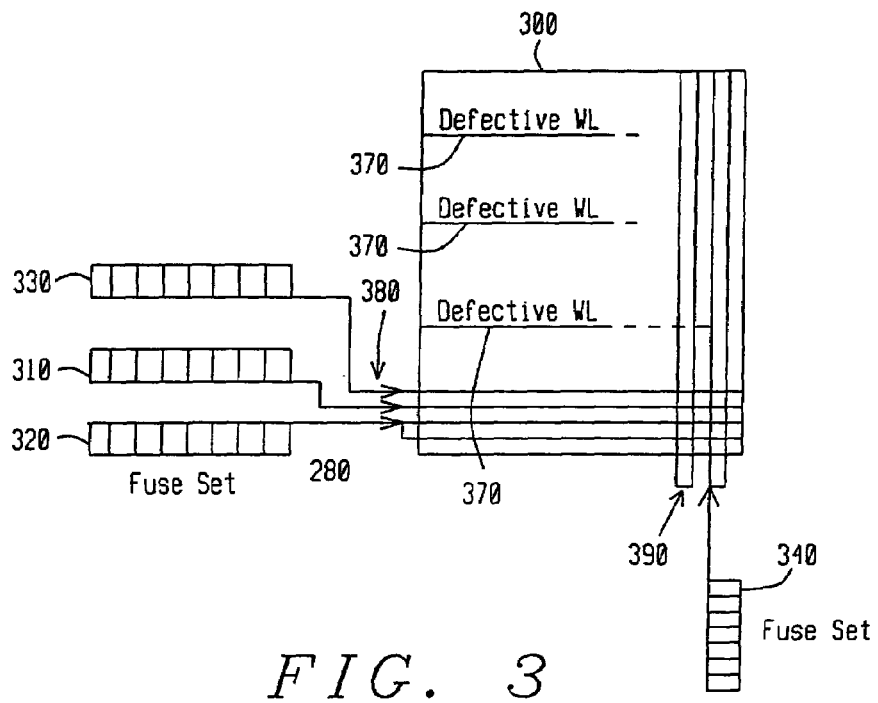
FIG. 3 shows the same block diagram as in FIG. 2 after a re-configuration of fuse sets.

FIG. 2 shows the memory array 200 with defective word lines (WL) 270. The column line driver bits RCCL0–3, 260 and the word line (row) driver bits RRWL0–3, 250 are shown. The row fuse sets 210, 220 are shown. Also, the column fuse sets 230, 240 are illustrated. FIG. 2 illustrates the case where a third row fuse set is needed but only two row fuse sets exist. A spare column fuse set 230 is switched via a circuit mechanism 290 to the required row position 280. The end result of the one fuse set switching from the column to the row is shown in FIG. 3.

FIG. 3 illustrates the fuse sets of FIG. 2 after the re-configuration introduced in FIG. 2. The memory array 300 contains the defective word lines 370. The column fuse set 330 has been made a row fuse set 330. Column line 390 no longer has a fuse set because it does not need one.

Figure 4:
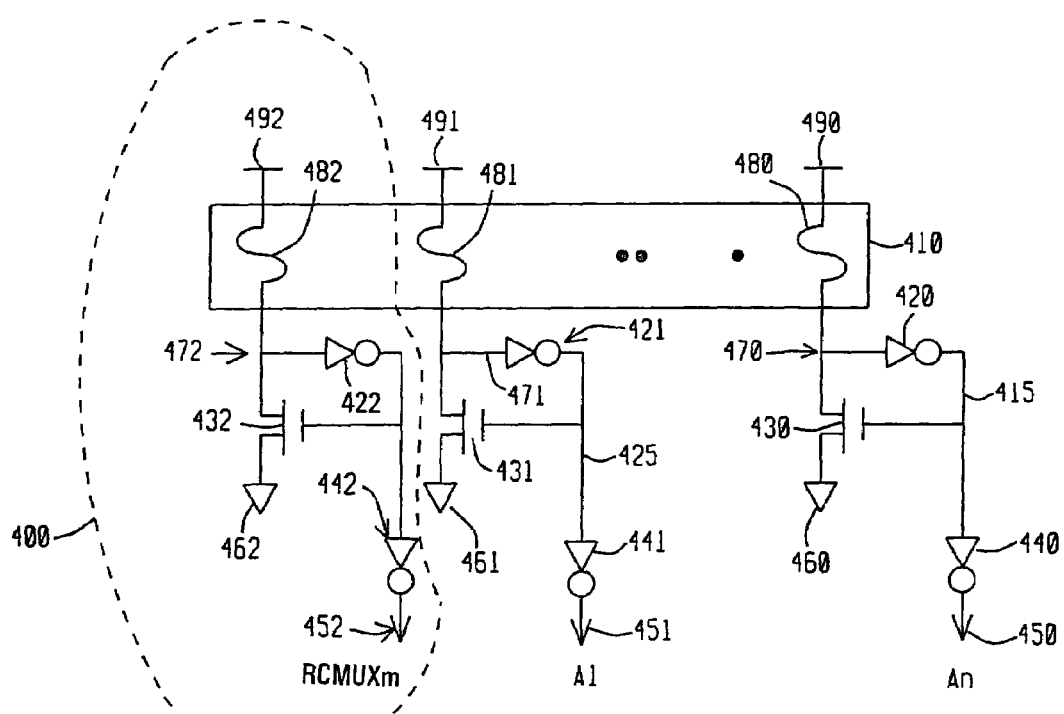
FIG. 4 illustrates the fuse set design of this invention.

FIG. 4 shows the fuse set design 410 which includes the fuses 480, 481, 482 to be burned if necessary. It also shows that the fuses are connected to Vcc, the power supply voltage and to a circuit. One end 470 of the fuse 480 is connected to the input of inverter 420 and to the drain of NMOS FET 430. The output of inverter 420 is connected to the gate of NMOS FET 430 and to the input of inverter 440. The source of NMOS FET 430 is connected to ground 460. The output of inverter N side of PN diode 440 is the output signal 'An' 450. When fuse 480 is burned out to create an open, the voltage at 470 is low and the voltage at 415 is high. Also, the voltage at 'An' is low. This low level on signal 'An' enables this bit of the fuse set which in turn selects an unused row or column line for use in the replacement or repair of a defective row or column line. If the fuse 480 is not burned the voltage at 'An' 450 remains high indicating that the fuse 480 has not been used for repairs.

Similarly, one end 471 of the fuse 481 is connected to the input of inverter 421 and to the drain of NMOS FET 431. The output of inverter 421 is connected to the gate of NMOS FET 431 and to the input of inverter 441. The source of NMOS FET 431 is connected to ground 461. The output of inverter 441 is the output signal 'A1' 451. When fuse 481 is burned out to create an open, the voltage at 471 is low and the voltage at 425 is high. Also, the voltage at 'A1' is low. The low level on signal 'A1' enables this bit of the fuse set which in turn selects an unused row or column line for use in the replacement or repair of a defective row or column line. If the fuse 481 is not burned the voltage at 'A1' 451 remains high indicating that the fuse 481 has not been used for repairs.

Similarly, one end 472 of the fuse 482 is connected to the input of inverter 431 and to the drain of NMOS FET 432. The output of inverter 431 is connected to the gate of NMOS FET 432 and to the input of inverter 422. The source of NMOS FET 432 is connected to ground 462. The output of inverter 442 is the output signal 'RCMUXm' 452. This signal indicates if the fuse set 410 has been used at all. When fuse 482 is burned out to create an open, the voltage at 472 is low and the voltage at 435 is high. Also, the voltage at 'RCMUXm' is low. This low level on signal 'RCMUXm' indicates that the fuse set has been used for repairs. If the fuse 482 is not burned the voltage at 'RCMUXm' 452 remains high indicating that the fuse set 410 has not been used for repairs.

Figure 5:
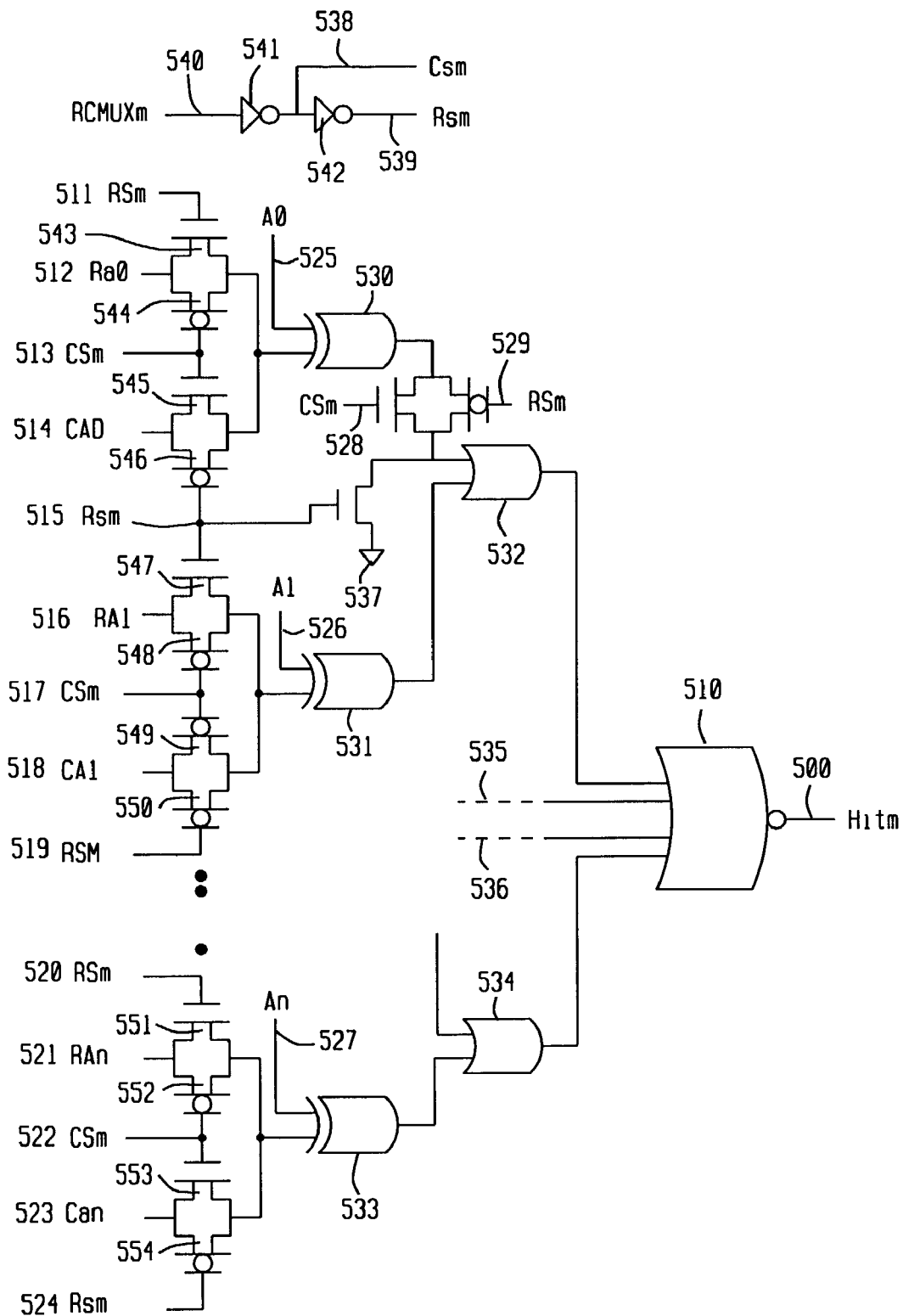
FIG. 5 illustrates the comparator and Hit circuit for the row fuse set of this invention.

FIG. 5 shows a comparator and Hit circuit for the row fuse sets. This circuit compares the regular row decode address with the redundant row address and produces a high level on the 'Hit' output signal 500 if there is any matches. The circuit takes in the RCMUXm 540 signal from the fuse set circuit of FIG. 4 and generates CSm 538 via one inverter 541 and RSm 539 via a second series inverter 542. The RSm signal and the CSm signal are combined with the RAn and CAn signal to produce the 'Hit' output for the row fuse set.

Figure 6:
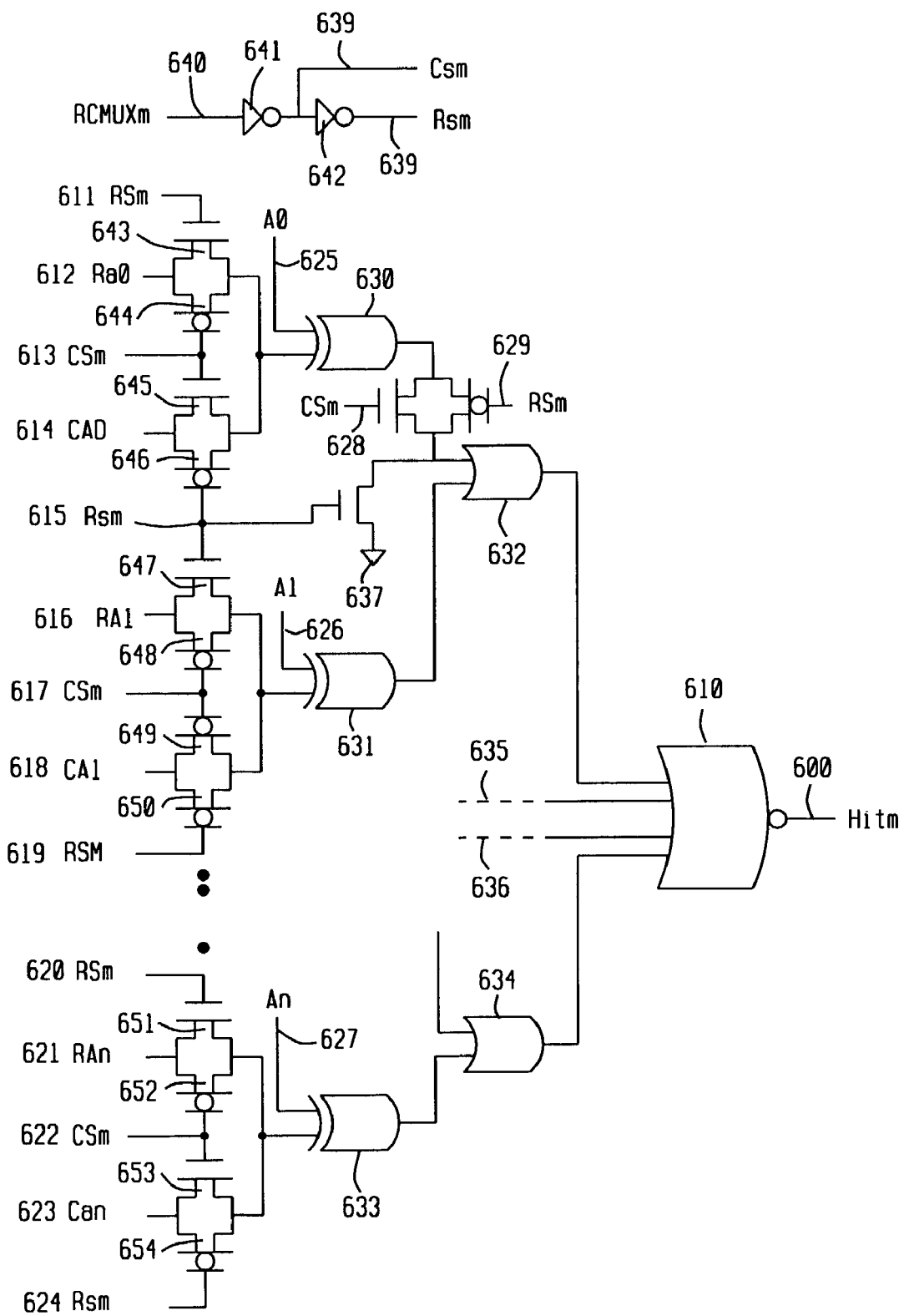
FIG. 6 illustrates the comparator and Hit circuit for the column fuse set of this invention.

FIG. 6 shows a comparator and Hit circuit for the column fuse sets. This circuit compares the regular column decode address with the redundant column address and produces a high level on the 'Hit' output signal 500 if there are any matches. The circuit takes in the RCMUXm 640 signal from the fuse set circuit of FIG. 4 and generates CSm 638 via one inverter 641 and RSm 639 via a second series inverter 642. The RSm signal and the CSm signal are combined with the RAn and CAn signal to produce the 'Hit' output for the column fuse set.

FIG. 7 shows a circuit which generates the redundant row (WL) and column addresses. The RHIT1, 2 (714, 734) signals are combined via NAND gates 710, 720, 730, 740 with the row factor or row address decode signals developed in FIG. 8 to produce the redundant row driver decode signals RRWL0–3. The CHIT1, 2 (754, 774) signals are combined via NAND gates 750, 760, 770, 780 with the column factor or column address decode signals developed in FIG. 8 to produce the redundant column driver decode signals RCCL0–3.

FIG. 8 illustrates two circuits which produce the row factors RF0–3—811, 821, 831, 841 and the column factors CF0–3—851, 861, 871, 881. These factors are simply the four decode states which result when you AND two address bits and their complements. The NAND gate 810 produces the output 811 through an inverter 812 which equals 'RA0 and RA1'. The NAND gate 820 produces the output 821 through an inverter 822 which equals 'NRA0 and RA1' where the 'N' denotes the inverse. The NAND gate 830 produces the output 831 through an inverter which equals 'RA0 and NRA1'. The NAND gate 840 produces the output 841 through an inverter which equals 'NRA0 and NRA1'.

Similarly, the NAND gate 850 produces the output 851 through an inverter 852 which equals 'CA0 and CA1'. The NAND gate 860 produces the output 861 through an inverter 862 which equals 'NCA0 and CA1' where the 'N' denotes the inverse. The NAND gate 870 produces the output 871 through an inverter which equals 'CA0 and NCA1'. The NAND gate 880 produces the output 881 through an inverter which equals 'NCA0 and NCA1'.

Figure 9:
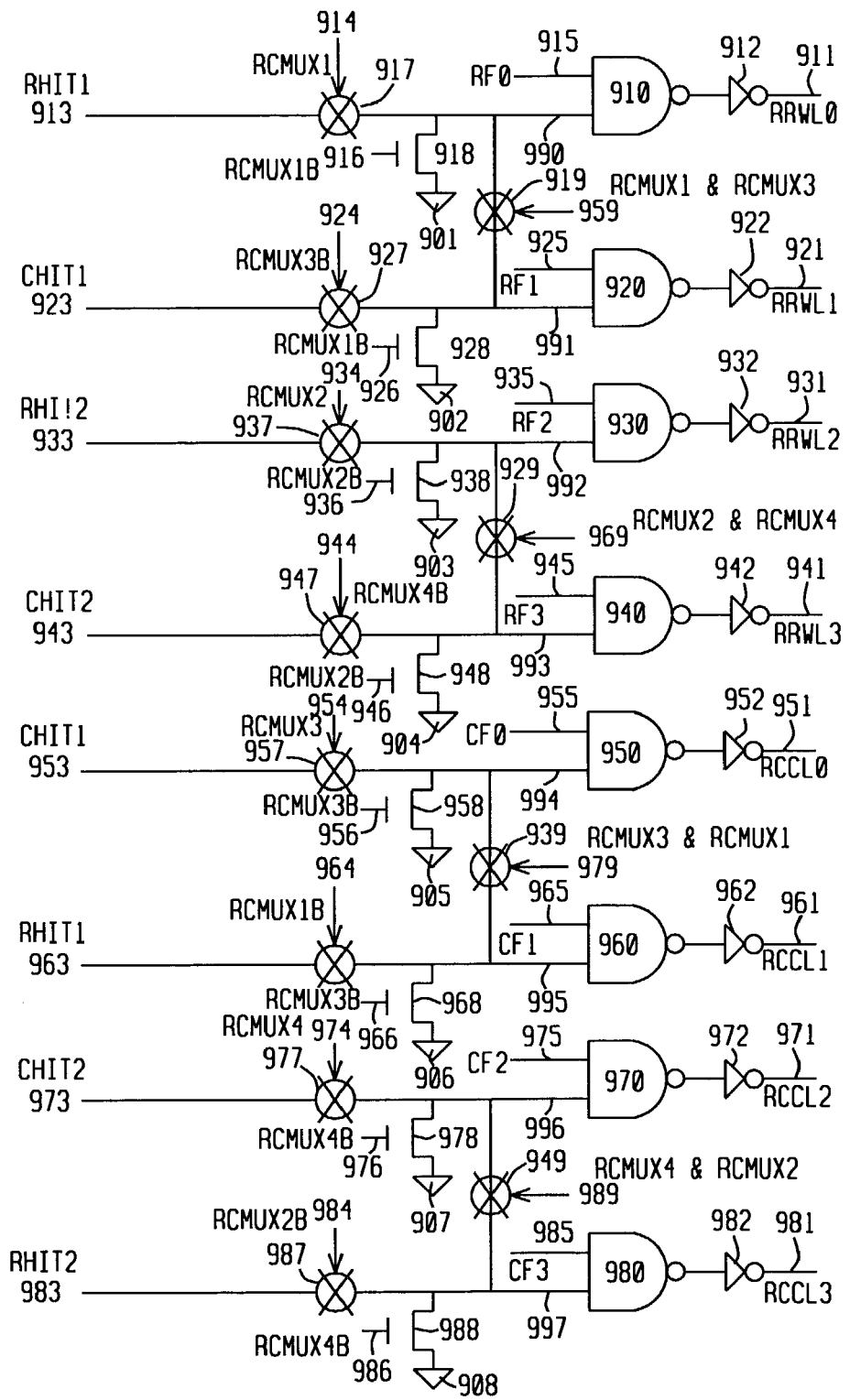
FIG. 9 illustrates a full example of the re-configuration circuitry of the invention.

FIG. 9 shows a circuit example which generates the redundant row line driver signals RRWL0–3 (911, 921, 931, 941) and the redundant column line driver signals RCCL0–3 (951, 961, 971, 981). Inputs to the circuit include the row 'Hit' and column 'Hit' signals as well as the RCMUX signals.

Figure 10:
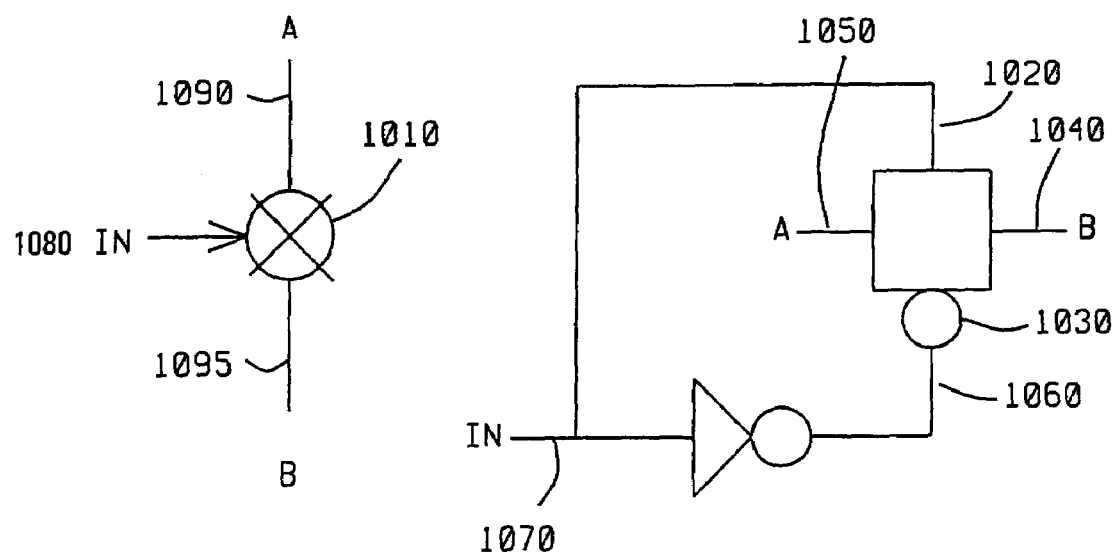
FIG. 10 shows the re-configurable redundancy word line and column line driver and its switching mechanism.

FIG. 10 shows the mechanism use to switch or interchange spare row and column line drivers. The switch is shown 1010. The fuse set input 1080 goes into the switch. The switch will connect to either A 1090 or B 1095. A and B represent row or column lines. In the detailed circuit, the switch is made up of an NMOS FET 1020 and a PMOS FET 1030. The gate of the NMOS FET 1020 is driven directly by the fuse set input 1070. The gate of the PMOS FET 1030 is driven by the inverse 1060 of the fuse set input. The row line could be A 1050, and the column line could be B 1040.

The advantages of this invention in the use of re-configurable fuse sets are as follows. Each fuse set can be used for either a row or a column, as needed, during a repair of the memory array. This allows the fuse sets to be allocated freely according to the process defects distribution on the chip and wafer. This results in higher repair efficiency and increased wafer yield.

Another key advantage of this fuse set embodiment is that the methodology of this invention not only increases the possibility to replace the defective word lines or row lines or column lines, but to also replace defective fuse set circuitry to increase the repair rate.

While this invention has been particularly shown and described with Reference to the preferred embodiments thereof, it will be understood by those Skilled in the art that various changes in form and details may be made without Departing from the spirit and scope of this invention.

What is claimed is:

1. A circuit which re-configures fuse sets in a semiconductor memory integrated circuit, which utilizes redundant memory rows and columns to repair defective cells within memory cell arrays to improve product yield, comprising:
   fuse sets which allow unused word lines of the memory cell array to be used to replace defective word lines,
   fuse sets which allow unused column lines of the memory cell array to be used to replace defective column lines, and at least one of the following:
   a) circuitry which allows the use of unused column lines to repair defective word lines,
   b) circuitry which allows the use of unused word lines to repair defective column lines,
   wherein there exists a sub-circuit, which allows the use of unused column lines to repair defective word lines and which allows the use of unused word lines to repair defective column lines, combines two row address lines, such as RA0 and RA11 and their complements, NRA0 and NRA1, to form four row factor lines, RF0–4.

2. The circuit of claim 1, further comprising:
   a redundant row driver circuit, and
   a redundant row fuse set.

3. The circuit of claim 1, further comprising:
   a redundant column driver circuit,
   and a redundant column fuse set.

4. The circuit of claim 1, wherein said fuse set is made up of:
  a fuse connected to Vcc, the power supply voltage, and connected to the input of an inverter 'A' and to the drain of an NMOS FET,
  said inverter whose output is connected to the gate of said NMOS FET and to the input of another inverter 'B', said NMOS FET whose source is connected to ground, and
  said inverter 'B' whose output is connected to a signal output, An.

5. The circuit of claim 4 wherein said signal output, An, in its '1' state is used to enable an original row or column driver.

6. The circuit of claim 4 wherein said signal output, An, in its '0' state is used to enable a spare row or column driver.

7. The circuit which re-configures fuse sets in a semiconductor memory integrated circuit of claim 1, wherein there exists a sub-circuit, which compares the actual row address presented to the memory array to the row address stored in a redundant row driver and fuse set logic.

8. The circuit which re-configures fuse sets in a semiconductor memory integrated circuit of claim 1, wherein there exists a sub-circuit, which compares the actual column address presented to the memory array to the column address stored in a redundant row driver and fuse set logic.

9. The circuit of claim 7 wherein said comparison circuit generates a signal, RHIT when the row address presented to the memory array equals one of the defective rows which was previously repaired using a spare fuse set.

10. The circuit of claim 8 wherein said comparison circuit generates a signal, CHIT when the column address presented to the memory array equals one of the defective columns which was previously repaired using a spare fuse set.

11. A method of re-configuring fuse sets in a semiconductor memory integrated circuit according to claim 1, which utilizes redundant memory rows and columns to repair defective cells within memory cell arrays to improve product yield comprising the steps of:
  testing wafers for defects and failures initially,
  assessing defect locations based on initial wafer testing,
  using fuse sets for either a row or column allowing further repair flexibility,
  using unused column lines to repair defective word lines or using unused word lines to repair defective column lines,
  downloading fuse burning information, burning fuses according to said download information, and
  testing the wafers after repair.

12. The method of claim 11 wherein said testing for defects in wafers initially includes the compilation of the memory cell location of the defects.

13. The method of claim 12 where said compilation of defects are used to convert said defective memory locations into a formulation which is usable by the fuse-burning algorithm.

14. The method of claim 12 wherein said downloading of fuse burning information is the transfer of the location map of defective memory cells into instructions understandable by an automated fuse burner.

15. The method of claim 14 wherein said automated fuse burner is used to open the fuse connections in the said fuse sets to allow the use of spare word lines and column lines in order to repair defects in the memory array.

16. The method of claim 12 wherein said testing of the chips on wafers is done to verify the successful repair of the chips on wafers.

17. A program retention device containing program instruction code executable on at least one networked computing device for use in the re-configuring fuse sets in a semiconductor memory integrated circuit according to claim 13, which utilizes redundant memory rows and columns to repair defective cells within memory cell arrays to improve product yield comprising the step of:
  manipulation of fuse utilization on said semiconductor memory integrated circuit to use a redundant column line to repair a defective word line or use a redundant word line to repair a defective column line.

18. A circuit which re-configures fuse sets in a semiconductor memory integrated circuit, which utilizes redundant memory rows and columns to repair defective cells within memory cell arrays to improve product yield, comprising:
  fuse sets which allows unused word lines of the memory cell array to be used to replace defective word lines,
  fuse sets which allow unused column lines of the memory cell array to be used to replace defective column lines, and at least one of the following:
  a) circuitry which allows the use of unused column lines to repair defective word lines,
  b) circuitry which allows the use of unused word lines to repair defective column lines,
  wherein said fuse set is made up of:
    a fuse connected to Vcc, the power supply voltage, and connected to the input of an inverter 'A' and to the drain of an NMOS FET,
    said inverter whose output is connected to the gate of said NMOS FET and to the input of another inverter 'B',
    said NMOS FET whose source is connected to ground, and
    said inverter 'B' whose output is connected to a signal output, An, and
  wherein said signal output, An, in its '1' state is used to indicate that the fuse set is not swapped from row replacement use to column replacement use.

19. A circuit which re-configures fuse sets in a semiconductor memory integrated circuit, which utilizes redundant memory rows and columns to repair defective cells within memory cell arrays to improve product yield, comprising:
  fuse sets which allows unused word lines of the memory cell array to be used to replace defective word lines,
  fuse sets which allow unused column lines of the memory cell array to be used to replace defective column lines, and at least one of the following:
  a) circuitry which allows the use of unused column lines to repair defective word lines,
  b) circuitry which allows the use of unused word lines to repair defective column lines,
  wherein said fuse set is made up of:
    a fuse connected to Vcc, the power supply voltage, and connected to the input of an inverter 'A' and to the drain of an NMOS FET,
    said inverter whose output is connected to the gate of said NMOS FET and to the input of another inverter 'B',
    said NMOS FET whose source is connected to ground, and
    said inverter 'B' whose output is connected to a signal output, An, and
  wherein said signal output, An, in its '0' state is used to indicate that the fuse set is swapped from row replacement use to column replacement use.

20. A circuit which re-configures fuse sets in a semiconductor memory integrated circuit, which utilizes redundant memory rows and columns to repair defective cells within memory cell arrays to improve product yield, comprising:

fuse sets which allows unused word lines of the memory cell array to be used to replace defective word lines, fuse sets which allow unused column lines of the memory cell array to be used to replace defective column lines, and at least one of the following:

a) circuitry which allows the use of unused column lines to repair defective word lines, b) circuitry which allows the use of unused word lines to repair defective column lines, wherein there exists a sub-circuit, which allows the use of unused column lines to repair defective word lines and which allows the use of unused word lines to repair defective column lines, combines two column address lines, such as CA0 and CA1 and their complements, NCA0 and NCA1, to form four column factor lines, CF0–4.

21. A circuit which re-configures fuse sets in a semiconductor memory integrated circuit, which utilizes redundant memory rows and columns to repair defective cells within memory cell arrays to improve product yield, comprising:

fuse sets which allows unused word lines of the memory cell array to be used to replace defective word lines, fuse sets which allow unused column lines of the memory cell array to be used to replace defective column lines, and at least one of the following:

a) circuitry which allows the use of unused column lines to repair defective word lines, b) circuitry which allows the use of unused word lines to repair defective column lines, wherein there exists a sub-circuit, which allows the use of unused word lines to repair defective column lines, combines row Hit signals and a column Hit signal with row factor signals and column factor signals to generate row word line drivers 0–3.

22. A circuit which re-configures fuse sets in a semiconductor memory integrated circuit, which utilizes redundant memory rows and columns to repair defective cells within memory cell arrays to improve product yield, comprising:

fuse sets which allows unused word lines of the memory cell array to be used to replace defective word lines, fuse sets which allow unused column lines of the memory cell array to be used to replace defective column lines, and at least one of the following:

a) circuitry which allows the use of unused column lines to repair defective word lines, b) circuitry which allows the use of unused word lines to repair defective column lines, wherein there exists a sub-circuit, which allows the use of unused column lines to repair defective word lines and which allows the use of unused word lines to repair defective column lines, combines row Hit signals and a column Hit signal with row factor signals and column factor signals to generate column word line drivers 0–3.

* * * * *